(12) United States Patent
Li

(10) Patent No.: US 8,081,009 B2
(45) Date of Patent: Dec. 20, 2011

(54) PRINTED CIRCUIT BOARD TESTING FIXTURE

(75) Inventor: Bing Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 199 days.

(21) Appl. No.: 12/506,411

(22) Filed: Jul. 21, 2009

(65) Prior Publication Data

US 2010/0182032 A1    Jul. 22, 2010

(30) Foreign Application Priority Data

Jan. 16, 2009 (CN) .................. 2009 2 0300267 U

(51) Int. Cl.
*G01R 31/304* (2006.01)

(52) U.S. Cl. ............... 324/763.01; 324/757.02
(58) Field of Classification Search ............. 324/757.02, 324/763.01
See application file for complete search history.

(56) References Cited

U.S. PATENT DOCUMENTS

| | | | | |
|---|---|---|---|---|
| 5,191,282 A * | 3/1993 | Liken et al. | ............... | 324/537 |
| 5,268,637 A * | 12/1993 | Liken et al. | ............... | 324/756.02 |
| 5,416,427 A * | 5/1995 | Tracewell | ................ | 324/750.08 |
| 5,543,726 A * | 8/1996 | Boyette et al. | ............ | 324/750.22 |
| 6,066,957 A * | 5/2000 | Van Loan et al. | ........ | 324/750.19 |
| 6,100,706 A * | 8/2000 | Hamilton et al. | ........ | 324/750.05 |
| 6,150,825 A * | 11/2000 | Prokopp et al. | ................ | 324/537 |
| 6,208,130 B1 * | 3/2001 | Cochran et al. | .......... | 324/750.14 |
| 6,359,565 B1 * | 3/2002 | Pedoeem et al. | .............. | 340/584 |
| 6,496,025 B1 * | 12/2002 | Stadelmayer et al. | ... | 324/757.01 |
| 6,522,546 B1 * | 2/2003 | Boyer et al. | ................... | 361/720 |
| 6,867,579 B2 * | 3/2005 | Seppala et al. | ........... | 324/757.02 |
| 7,421,365 B2 * | 9/2008 | Repko et al. | .................. | 702/120 |
| 2007/0152694 A1 * | 7/2007 | Yin et al. | ...................... | 324/765 |

* cited by examiner

*Primary Examiner* — Huy Q Phan
*Assistant Examiner* — Joshua Benitez
(74) *Attorney, Agent, or Firm* — Altis Law Group, Inc.

(57) ABSTRACT

A printed circuit board (PCB) testing fixture secures at least one PCB, each having a port. The PCB testing fixture includes a fixing frame and a testing plate. The fixing frame defines at least one first sliding groove to receive an edge of the at least one PCB. The testing plate is adjustably fixed on the fixing frame, and includes at least one backplane each including a connector corresponding to the at least one first sliding groove individually. The connector connects to the port of the at least one PCB. A location on which the testing plate is fixed to the fixing frame can be altered to test PCBs of different sizes.

12 Claims, 4 Drawing Sheets

PRINTED CIRCUIT BOARD TESTING FIXTURE

BACKGROUND

1. Technical Field

The present disclosure relates to component testing equipment, and specifically, to a PCB testing fixture, which can fix a variety of PCBs of different sizes.

2. Description of Related Art

Generally, a PCB testing fixture is used to secure PCBs of the same size for testing. However, since different sizes of PCB may be applied in different electrical devices, a different PCB testing fixture is required for each PCB, which is both inconvenient and inefficient.

Therefore, a need exists in the industry to overcome the described limitations.

DETAILED DESCRIPTION

Figure 1:
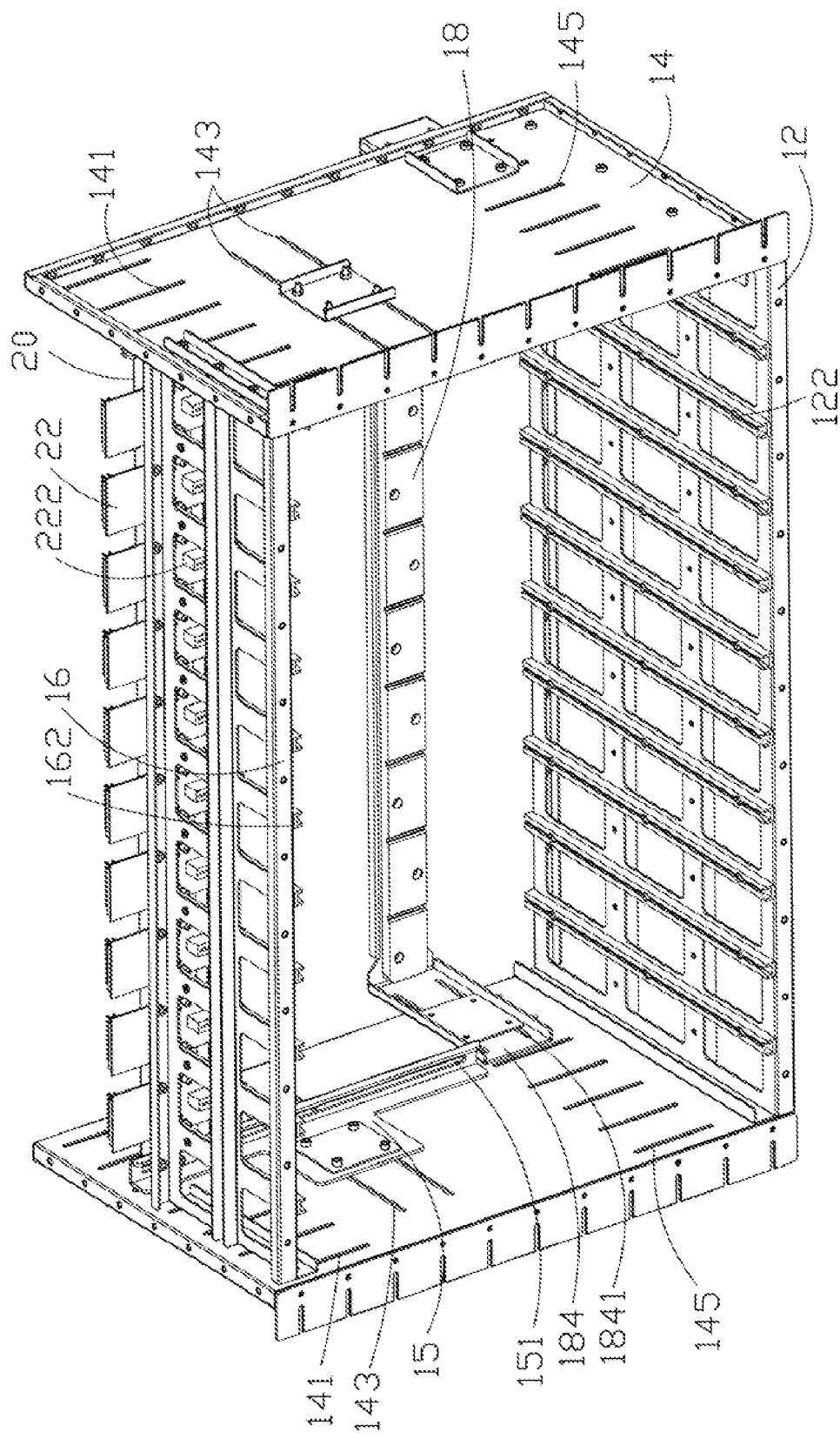
FIG. 1 is a perspective view of a PCB testing fixture in accordance with the disclosure.
Figure 2:
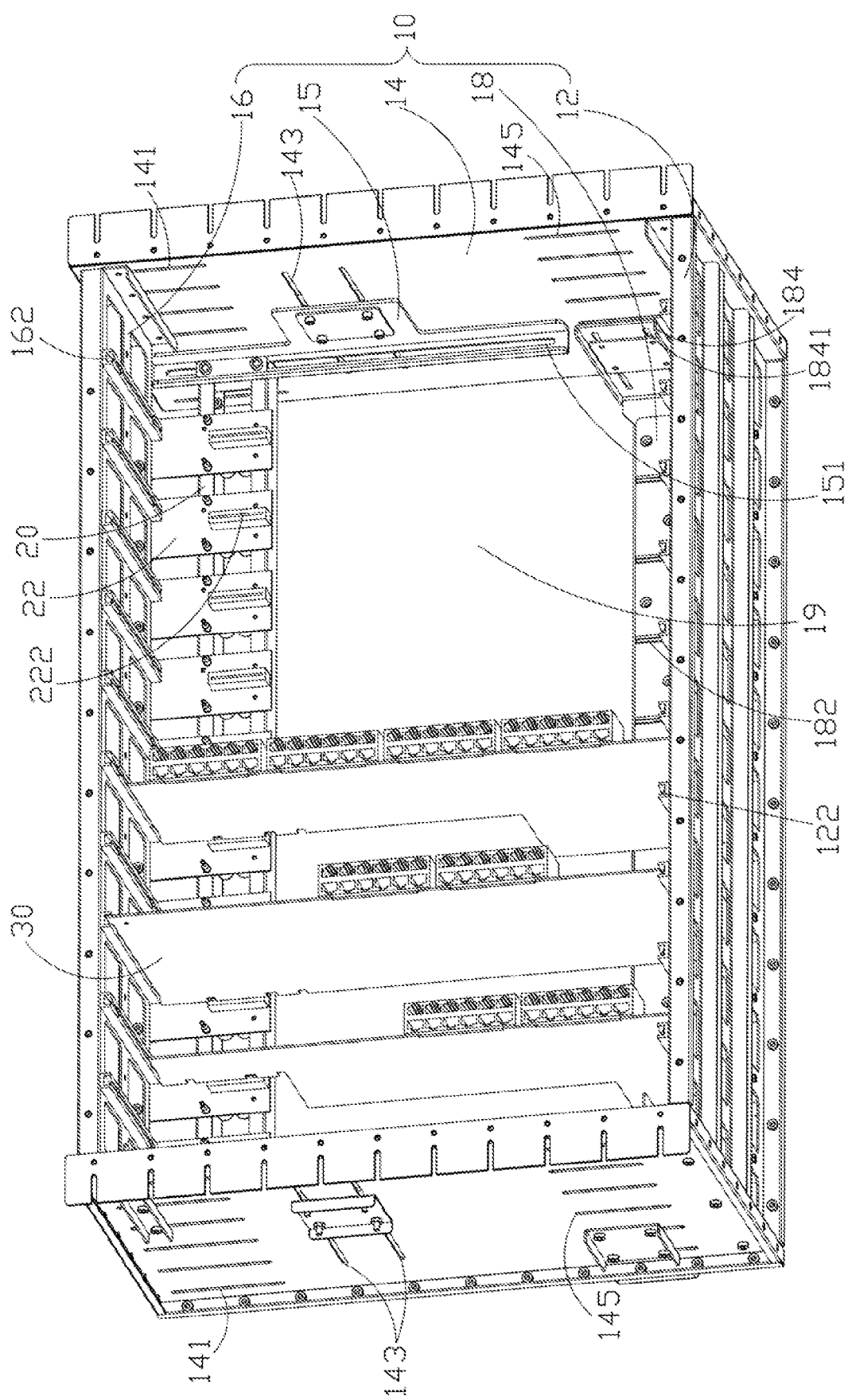
FIG. 2 is a perspective view of three PCBs received in the PCB testing fixture of FIG. 1.

Referring to FIG. 1-FIG. 2, a PCB testing fixture of the disclosure is used to test one or more PCBs 30, each having a port. The PCB testing fixture includes a fixing frame 10 configured to fix the PCBs 30 and a testing plate 20. The testing plate 20 includes a plurality of backplanes 22 each including a connector 222. A PCB 30 is fixed in the fixing frame 10, and the ports of the PCB 30 are connected to the connectors 222, so as to test the PCB 30. The testing plate 20 is adjustably installed on the fixing frame 10, therefore, the PCB testing fixture can fix a variety of PCBs of different sizes. That is, the connectors 222 of the backplanes 22 are movable corresponding to the adjustment of the testing plate 20 so that the connectors 222 of the backplanes 22 can connect to the port of the PCB 30 in multiple locations, allowing testing of various PCBs with different port configurations.

The fixing frame 10 includes a bottom fixing plate 12, an upper fixing plate 16, a back fixing plate 18 and a pair of adjusting plates 14. The bottom, upper, and back fixing plates 12, 16 and 18 define a plurality of first, second, and third sliding grooves 122, 162, and 182, respectively. The first sliding grooves 122 are substantially parallel and evenly spaced from each other. The first, second, and third sliding grooves 122, 162 and 182 all correspond to the connectors 222 of the plurality of backplanes 22 individually. In other embodiments, the bottom, upper, and back fixing plates 12, 16 and 18 can define only one first, second, and third sliding groove 122, 162 and 182, respectively, to minimize the footprint of the PCB testing fixture, in which case the testing plate 20 includes only one backplane 22.

One end of each adjusting plate 14 is installed on one of two opposite sides of the bottom fixing plate 12. Here, the pair of adjusting plates 14 is perpendicular to the bottom fixing plate 12. Each of the pair of adjusting plates 14 defines a plurality of first guide holes 141, two second guide holes 143 and a plurality of third guide holes 145. The first guide holes 141 are near the other ends of the pair of the adjusting plates 14. The third guide holes 145 are near the bottom fixing plate 12. The first and third guide holes 141, 145 all extend perpendicular to the bottom fixing plate 12. The second guide holes 143 are located between the first and third guide holes 141, 145, and extend parallel to the bottom fixing plate 12.

The upper fixing plate 16 is substantially parallel to and faces the bottom fixing plate 12, and is adjustably installed in the first guide holes 141 of the pair of adjusting plates 14, such that a distance between the bottom and upper fixing plate 12, 16 can be adjusted to secure a variety of PCBs 30 of different sizes.

The back fixing plate 18 is perpendicular to the bottom and upper fixing plates 12, 16, and installed in two of the third guide holes 145. Alternatively, the third plate 18 can be installed in one or more of the third guide holes 145. The back fixing plate 18 includes a pair of fixing portions 184 vertically extending from two ends of the back fixing plate 18, respectively. Each of the fixing portions 184 defines two fourth guide holes 1841. Alternatively, one or more fourth guide holes 1841 may be defined in each of the fixing portions 184. The back fixing plate 18 is adjustably installed on the pair of adjusting plates 14 via a plurality of fasteners (not labeled) passing through the fourth guide holes 1841 and the third guide holes 145 and engaging a plurality of receiving fasteners (not labeled).

Figure 3:
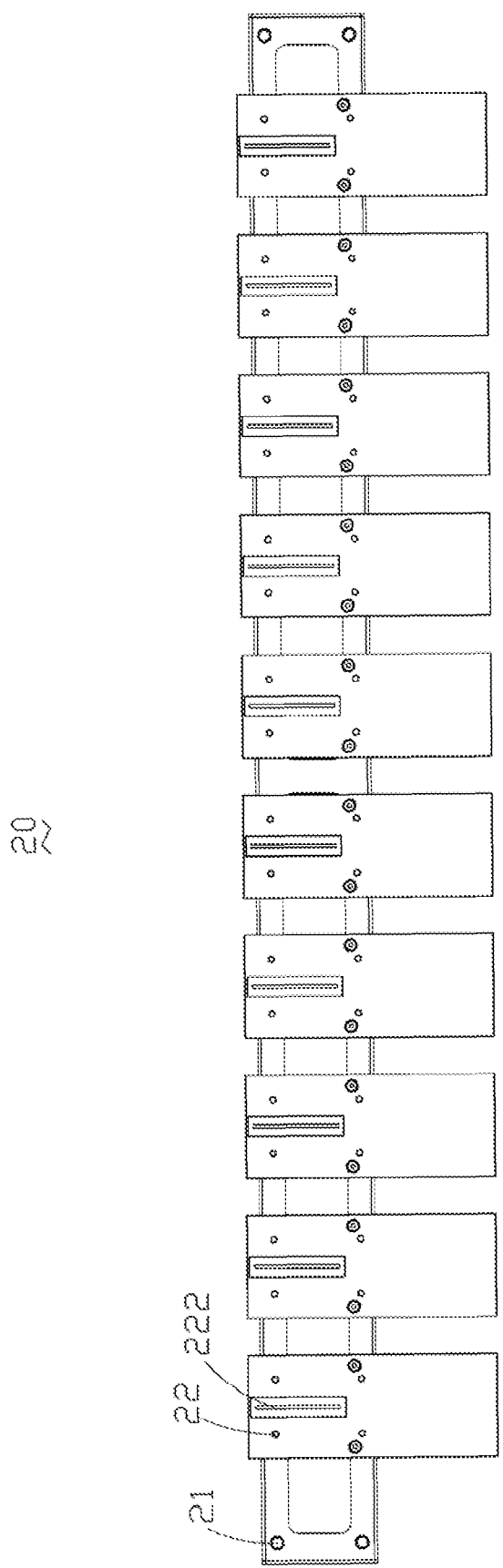
FIG. 3 is a front view of a testing plate of the PCB testing fixture of FIG. 1.
Figure 4:
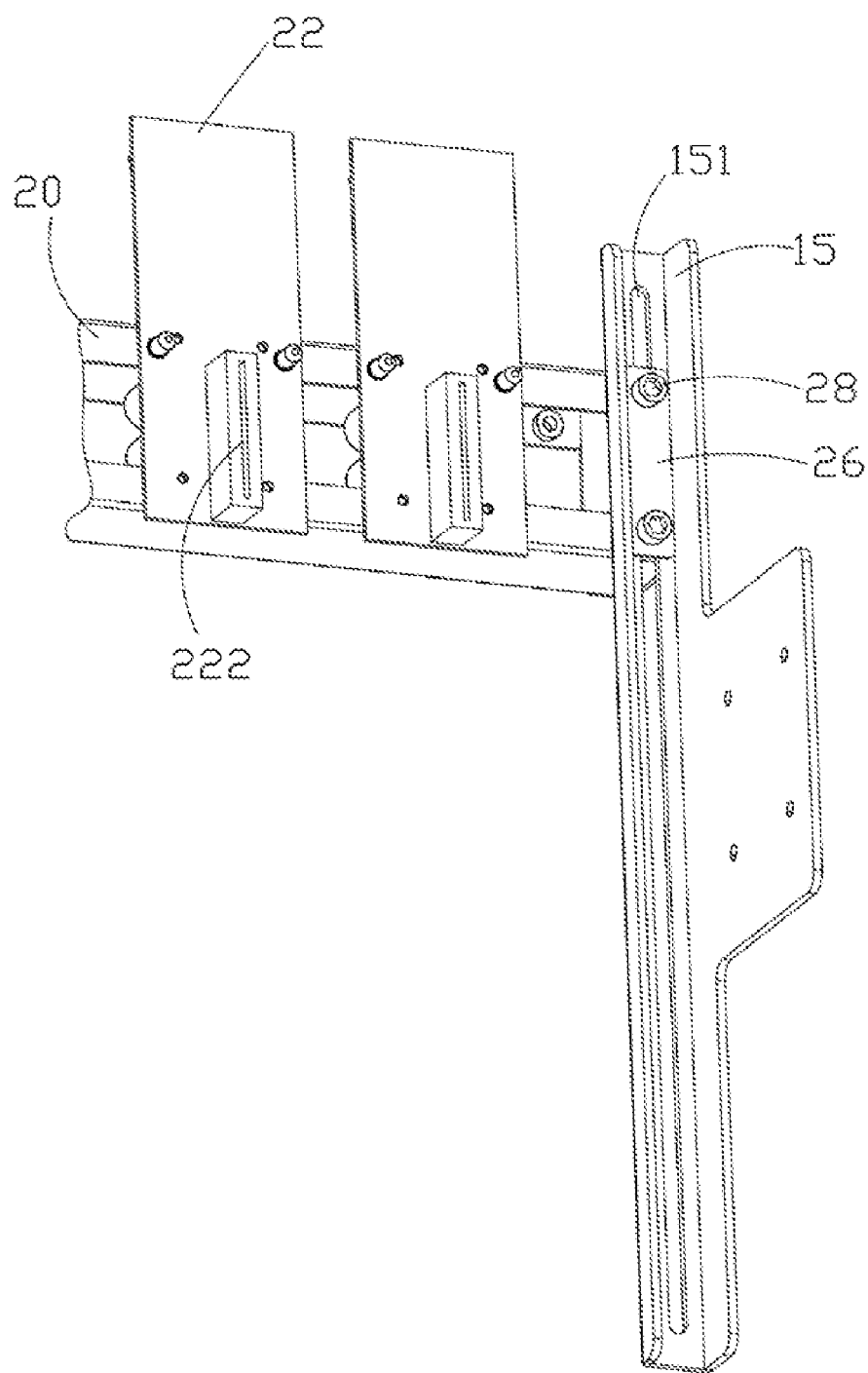
FIG. 4 is a perspective view of a connecting member installed on the testing plate of FIG. 1.

Referring to FIG. 3-FIG. 4, the testing plate 20 is installed on the pair of adjusting plates 14 via a pair of connecting members 15. The pair of connecting members 15 is respectively installed in the second guide holes 143 of the adjusting plates 14, and each defines a guide slot 151 extending along an axis different from that of the second guide holes 143. In this embodiment, the guide slots 151 extend vertically to the bottom fixing plate 12 after assembly.

The testing plate 20 defines two positioning holes 21 in each of the two opposite ends thereof. Alternatively, one or more positioning holes 21 can be defined in each of the two opposite ends. Each end of the testing plate 20 is moveably installed on one of the pair of connecting members 15 via two fasteners 28 passing through a washer 26 and the guide slot 151, and engaging the positioning holes 21. The testing plate 20 can move along the guide slots 151 of the pair of connecting members 15 and be fixed on the connecting members 15, and the pair of connecting members 15 also can move along the second guide holes 143 and be fixed on the pair of adjusting plates 14. The guide slots 151 extend along a direction different from that of the second guide holes 143. Thus, a location on which the testing plate 20 is fixed on the adjusting plates 14 can be adjusted in any direction.

During assembly, the bottom, upper, and back fixing plates 12, 16 and 18, the testing plate 20 and the pair of adjusting plates 14 cooperatively surround a receiving space 19 with an opening. The PCBs 30 to be tested are received in the receiving space through the opening, and fixed in the PCB testing fixture via several edges of the PCBs fitting into the first, second, and third sliding grooves 122, 162 and 182 of the bottom, upper and back fixing plates 12, 16 and 18 and the ports of the PCBs inserted into the connectors 222 of the testing plate 20. That is, the first, second, and third sliding grooves 122, 162 and 182 of the bottom, upper and back fixing plates 12, 16 and 18 secure the PCBs 30 in the PCB testing fixture.

The PCB testing fixture secures a variety of PCBs 30 of different sizes by adjusting the location where the testing plate 20 is fixed on the adjusting plates 14.

While exemplary embodiments have been described, it should be understood that they have been presented by way of example only and not by way of limitation. The breadth and scope of the disclosure should not be limited by the described exemplary embodiments, but only in accordance with the following claims and their equivalents.

What is claimed is:

1. A printed circuit board (PCB) testing fixture used to fix at least one PCB comprising a port, the PCB testing fixture comprising:
    a fixing frame, defining at least one first sliding groove to secure the at least one PCB; and
    a testing plate adjustably installed on the fixing frame, configured with at least one backplane corresponding to the at least one first sliding groove, each backplane comprising a connector connecting to the port of the at least one PCB;
    wherein the connector of the backplane is movable corresponding to adjustment of the testing plate;
    wherein the fixing frame comprises a bottom fixing plate in which the at least one first sliding groove is defined, and a pair of adjusting plates respectively installed on two opposite sides of the bottom fixing plate; and
    wherein the fixing frame further comprises a pair of connecting members movably installed on the pair of adjusting plates, respectively, wherein the testing plate is fixed on the pair of connecting members.

2. The PCB testing fixture as claimed in claim 1, wherein each of the pair of connecting members defines a guide slot to receive the testing plate, wherein the guide slots extend vertically to the bottom fixing plate.

3. The PCB testing fixture claimed in claim 2, wherein the pair of connecting members move and fix to the pair of adjusting plates is perpendicular to the guide slots.

4. The PCB testing fixture claimed in claim 1, wherein the fixing frame further comprises an upper fixing plate facing the bottom fixing plate and adjustably fixed on the pair of adjusting plates, and wherein the upper fixing plate defines at least one second sliding groove corresponding to the at least one first sliding groove to secure the at least one PCB.

5. The PCB testing fixture claimed in claim 4, wherein the upper fixing plate is substantially parallel to the bottom fixing plate, and perpendicular to the pair of adjusting plates.

6. The PCB testing fixture as claimed in claim 4, wherein the fixing frame further comprises a back fixing plate located between the first and upper fixing plates and adjustably fixed on the pair of adjusting plates, and wherein the back fixing plate defines at least one third sliding groove corresponding to the at least one first sliding groove to secure the at least one PCB.

7. The PCB testing fixture claimed in claim 6, wherein the first sliding grooves are parallel to and evenly spaced apart from each other.

8. A printed circuit board (PCB) testing fixture used to fix a PCB comprising a port, the PCB testing fixture comprising:
    a fixing frame, comprising:
        a bottom fixing plate defining at least one first sliding groove to secure the PCB;
        a pair of adjusting plates installed on two opposite sides of the bottom fixing plate respectively, each of the adjusting plates defining a plurality of first guide holes and a plurality of second guide holes;
        an upper fixing plate with two sides adjustably installed in the first guide holes of the adjusting plates respectively, and defining at least one second sliding groove to secure the PCB with the first sliding groove collectively; and
        a pair of connecting members movably installed in the second sliding holes and each defining a guide slot extending along a direction different from that of the second guide holes; and
    a testing plate adjustably installed in the guide slot configured with at least one backplane corresponding to the at least one first sliding groove, each backplane comprising a connector connecting to the port of the PCB;
    wherein the backplane is movable corresponding to adjustment of the testing plate so that the connector of the backplane can connect to the port of the PCB at multiple locations.

9. The PCB testing fixture as claimed in claim 8, wherein the plurality of first guide holes extends vertically to the bottom fixing plate.

10. The PCB testing fixture as claimed in claim 9, wherein the plurality of second guide holes extends parallel to the bottom fixing plate.

11. The PCB testing fixture as claimed in claim 10, wherein the pair of guide slots extends perpendicular to the bottom fixing plate.

12. The PCB testing fixture as claimed in claim 11, wherein the fixing frame further comprises a back fixing plate located between the bottom and upper fixing plate and adjustably fixed on the pair of adjusting plates, and wherein the back fixing plate defines at least one third sliding groove corresponding to the at least one first sliding groove to secure the PCB.

* * * * *